United States Patent [19]

Jones et al.

[11] Patent Number: 4,788,547
[45] Date of Patent: Nov. 29, 1988

[54] STATIC-SPLIT TRACKING RADAR SYSTEMS

[75] Inventors: Michael A. Jones, Stanmore; John R. G. Woods, Bushey, both of England

[73] Assignee: The Marconi Company Limited, England

[21] Appl. No.: 408,294

[22] Filed: Oct. 16, 1973

[30] Foreign Application Priority Data

Oct. 17, 1972 [GB] United Kingdom ............ 47866

[51] Int. Cl.$^4$ .............................................. G02S 13/44
[52] U.S. Cl. .................................. 342/100; 342/80; 342/103; 342/151
[58] Field of Search ............. 343/7 A, 16 M; 342/80, 342/100, 103, 149, 151

[56] References Cited

U.S. PATENT DOCUMENTS

| | | | |
|---|---|---|---|
| 3,078,457 | 2/1963 | Himler et al. | 343/7 A X |
| 3,141,164 | 7/1964 | Holcomb et al. | 343/16 M |
| 3,212,083 | 10/1965 | Hinchman | 343/7 A X |
| 3,720,941 | 3/1973 | Ares | 343/7 A |
| 3,727,227 | 4/1973 | Takao et al. | 343/7 A X |
| 3,757,326 | 9/1973 | White | 343/7 A |
| 4,159,475 | 6/1979 | Andre et al. | 342/103 |
| 4,228,434 | 10/1980 | Williamson et al. | 342/100 |
| 4,368,468 | 1/1983 | Lisle et al. | 342/151 |
| 4,672,330 | 6/1987 | Floyd et al. | 342/103 X |

Primary Examiner—T. H. Tubbesing
Attorney, Agent, or Firm—Kirschstein, Kirschstein, Ottinger & Israel

[57] ABSTRACT

A static-split tracking radar system with substantially improved performance. The system includes parallel signal processing channels for processing sum and difference signals from a target-seeking aerial array, to produce target tracking signals. Novel means are provided for trimming relative phase and gain of these channels to achieve substantially perfect matching, which gives a receiver stability sufficient for homing head use in a guided missile system. The system also includes a receiver for acquiring a reference frequency signal, the receiver having novel bandwidth adaptation and doppler tracking facilities. Other novel features provide improved clutter rejection and jamming immunity.

16 Claims, 2 Drawing Sheets

STATIC-SPLIT TRACKING RADAR SYSTEMS

This invention relates to static-split tracking radar systems.

In a typical static-split tracking radar system, a target is tracked by means of a multi-element aerial, producing a plurality of RF outputs. These outputs may typically be added and subtracted to produce a sum signal and at least one difference signal, which signals are processed in a multi-channel receiver, and the resulting IF outputs are then compared in amplitude and/or phase so as to produce at least one output signal, representing the orientation of the target relative to the aerial.

In such a system, it is clearly most important for the channels of the multi-channel receiver to be accurately matched both in gain and in phase change, so as to avoid errors in the final output signals. Accordingly, one object of the present invention is to facilitate the matching of a plurality of receiver channels in a static-split tracking radar system.

According to a first aspect of the invention, there is provided a static-split tracking radar system comprising an aerial having a plurality of outputs, a first combining circuit for combining signals from said aerial outputs to produce at least two receiver input signals, the relative phases and/or amplitudes of which contain information characterising the orientation of a target relative to the aerial, a receiver having at least two channels to which said receiver input signals are respectively applied, and a second combining circuit for combining output signals from the channels of said receiver to produce at least one feedback signal, said first and second combining circuits being such that said feedback signal characterises the degree of mismatch in gain and/or phase change between said channels, the system also comprising at least one trimming circuit responsive to a said feedback signal for automatically correcting any mismatch in gain and/or phase between said channels.

In a preferred form of the invention, said first combining circuit is arranged to introduce modulation into said receiver input signals, in synchronism with a modulating waveform, so as to cause said receiver input signals to vary periodically in amplitude and phase relative to each other in such a manner that the average value of their difference, over one period of said modulating waveform, is zero, and said feedback signal is obtained by averaging the difference of the output signals from said receiver channels over at least one period of said modulating waveform, whereby, when said channels are equally matched, said feedback signal is zero, and when said channels are mismatched said feedback signal is non-zero.

In a particular arrangement in accordance with the invention, said first combining circuit is arranged to add and subtract said signals from said aerial outputs to produce a sum signal and at least two difference signals, and said modulation is introduced by multiplexing said difference signals together in synchronism with said modulating waveform to form a multiplexed difference signal. The first combining circuit may conveniently add together said sum signal and said multiplexed difference signal to form one of said receiver input signals, and to subtract said sum signal and said multiplexed difference signal, to form the other of said receiver input signals. Conveniently, said multiplexing comprises phase-modulating the two difference signals by 180° in synchronism with the modulating waveform, the modulation applied to one difference signal being in quadrature, with respect to the modulating waveform, relative to the modulation applied to the other difference signal, and adding together the modulated difference signals to produce said multiplexed difference signal.

Tracking radar systems generally include a superheterodyne receiver for processing signals from the aerial of the system. Such a receiver includes a local oscillator, the output of which is mixed with the aerial RF output signals to convert them to a suitable intermediate frequency. If the system is subjected to adverse environmental conditions, such as severe vibration as in the case where the radar system is carried in a moving body, such as a missile, the output of the local oscillator may become noisy, having a number of vibration sidebands, and this may adversely affect the performance of the system. It is known in such cases to provide a second aerial for receiving a reference signal (e.g. from the launching aircraft, or from a ground station), and a phase-locked loop for locking the frequency of the local oscillator in a fixed relationship to that of the reference signal. A so-called "rear reference loop" of this kind considerably reduces the noise sidebands of the local oscillator, and this improves the overall system performance.

Another object of the present invention is to provide an improved rear-reference loop for a radar system.

According to a second aspect of the invention, a tracking radar system for use in a moving body comprises: a first aerial; a superheterodyne receiver for processing signals from the first aerial, the receiver including a local oscillator; a second aerial for receiving a reference signal; and a phase-locked loop for locking the frequency of said local oscillator in a fixed relationship to that of the reference signal; wherein the bandwidth of the phase-locked loop is, in operation, automatically adjusted according to the received strength of the reference signal, so that when the received reference signal is strong, the bandwidth is relatively wide, and when the received reference signal is weak, the bandwidth is relatively narrow.

The phase-locked loop thus automatically adapts to the condition of the reference signal. In general, the reference signal will initially be strong, and the loop bandwidth wide, so that a significant reduction in the noise sidebands of the oscillator is obtained. Moreover, if the level of the reference signal should drop, the bandwidth of the reference loop will automatically become narrower, so as to improve the signal-to-noise ratio of the received reference signal, at the expense of allowing the oscillator to become noiser.

According to a third aspect of the invention, a tracking radar system includes an aerial, a superheterodyne receiver including a local oscillator the output of which is mixed with the radio-frequency aerial output to convert it to an intermediate frequency signal, and a bandpass filter which passes only a restricted range of intermediate frequencies, wherein the output of the filter is fed to a frequency discriminator which produces an output representative of the difference between the frequency of said intermediate frequency signal and the centre of the passband of said filter, the discriminator output being used to control the frequency of said local oscillator in such a manner as to tend to maintain the frequency of said intermediate frequency signal in the centre of said passband, thereby causing the system to track frequency shifts of radio waves received from a target (e.g. doppler shifts resulting from relative movement of the target and the aerial).

The system in accordance with the third aspect of the invention differs from previously known doppler tracking systems, in that the tracking is performed by varying the frequency of the first local oscillator, instead of by means of an additional oscillator at some subsequent point of the receiver. This permits the narrow bandpass filter to be positioned at an early point in the receiver, with resulting simplification of the subsequent stages of the receiver.

The local oscillator may be controlled by a reference signal in a phase-locked loop, and in that case the output of the frequency discriminator may be used to control the phase-locked loop, so as to control the local oscillator frequency.

According to a fourth aspect of the invention, a tracking radar system comprises an aerial arrangement having a plurality of outputs, means for deriving from the aerial outputs a sum signal, representative of the sum of the aerial outputs, and a difference signal representative of the orientation of a target relative to the aerial, and a receiver for processing said signals to produce corresponding intermediate frequency output signals, wherein the IF sum signal is compared with the output of an oscillator in a phase-locked loop, and the result used to control the oscillator frequency so as to cause the oscillator to lock on to the frequency of the IF sum signal, the IF difference signal being compared in a phase-sensitive detector with the output of the oscillator, so as to produce an output representative of the phase difference between the sum and difference signals.

In this way, the phase-locked loop acts effectively as a narrow band filter to select a single IF frequency, and thus assists in discriminating between targets having different doppler shifts.

One radar system in accordance with the invention will now be described, by way of example, with reference to the accompanying drawings, of which:

The system to be described is part of a homing head for an air-to-air missile. The system is a semiactive one, in which the target is illuminated with radio waves from a source remote from the missile e.g. from the radar of the aircraft which launched the missile.

Figure 1:
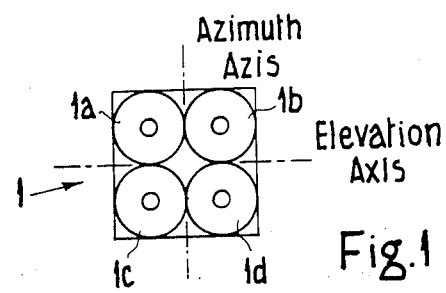
FIG. 1 is a schematic front elevation of the aerial of the radar system.

Referring to FIG. 1, the system includes an aerial arrangement 1, comprising an array of four aerial elements $1a$–$1d$, each of which has its own feed antenna and reflector dish. The axes of the four elements $1a$–$1d$ are all parallel to each other, so that when a radio signal is received from a target by the aerial, the resulting output signals from the four elements are all of substantially equal amplitude, but differ in phase, according to the orientation of the target relative to the aerial. The aerial arrangement 1 is mounted on gimbals (not shown) so that it can be tilted about azimuth and elevation axes, by means of servo motors (not shown).

Figure 2:
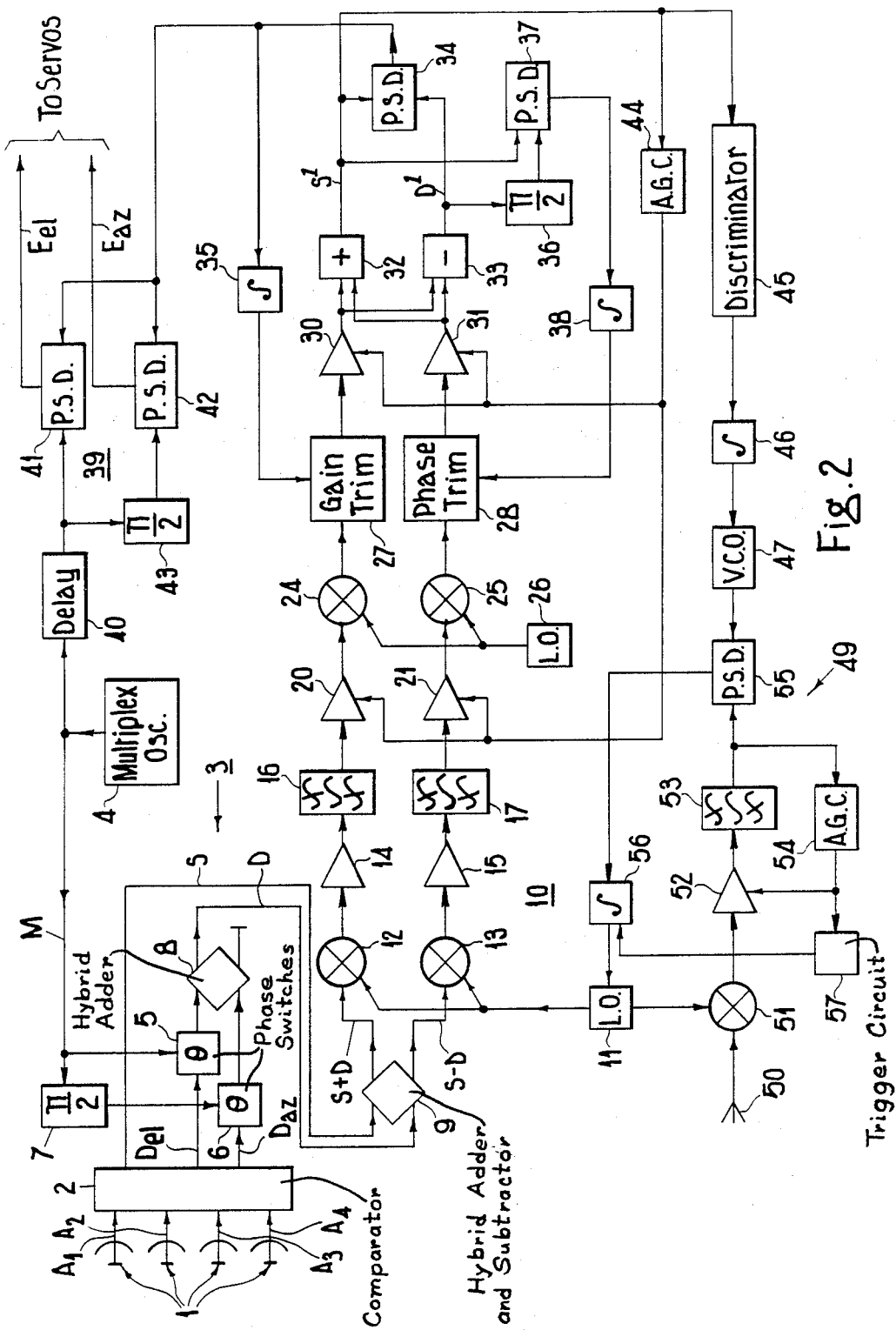
FIG. 2 is a schematic block circuit diagram of the system.

Referring now to FIG. 2, the four aerial output signals are designated $A_1$, $A_2$, $A_3$ and $A_4$. These output signals are added and subtracted in a suitable circuit 2, to produce three signals S, $D_{el}$ and $D_{az}$, as follows:

$$S = (A_1 + A_2 + A_3 + A_4)$$

$$D_{el} = (A_1 + A_2) - (A_3 + A_4)$$

$$D_{az} = (A_1 + A_3) - (A_2 + A_4)$$

S is referred to as the sum signal, and is equal to the sum of the aerial outputs. $D_{el}$ and $D_{az}$ are referred to as the elevation and azimuth difference signals, and their amplitudes are measures of the elevation and azimuth error angles between the aerial axis and the target. Because of a 90°, phase shift in the comparator 2, the signals $D_{el}$ and $D_{az}$ are approximately in phase with the sum signals. These three signals, $D_{el}$, $D_{az}$ and S pass through a rotating microwave joint on the aerial 1 to the following circuitry.

The two difference signals are multiplexed together in a multiplexer 3, which is controlled by a square wave modulating signal M from an oscillator 4. The multiplexer 3 comprises two phase switches 5 and 6 for phase modulating the signals $D_{el}$ and $D_{az}$ respectively. Phase switch 5 is driven directly by the output of the oscillator 4, and produces alternate 0°, and 180° phase shifts in the $D_{el}$ signal, in phase with the modulating signal M. Phase switch 6 is driven by the oscillator 4 via a 90°, phase shifter 7, and produces alternate 0°, and 180° phase shifts in the $D_{az}$ signal, in quadrature with the modulation of the $D_{el}$ signal.

The outputs of the phase switches 5 and 6 are added together in a hybrid circuit 8, to produce a multiplexed difference signal D. It will be seen that the signal D, in each cycle of the modulating signal M, passes through the following sequence of values:

$$D_1 = D_{el} + D_{az}$$

$$D_2 = D_{el} - D_{az}$$

$$D_3 = -D_{el} - D_{az}$$

$$D_4 = -D_{el} + D_{az}$$

The difference signal D is fed to a hybrid circuit 9, along with the sum signal S, to produce two output signals S+D and S−D, which are fed respectively to two channels of a superheterodyne receiver 10. Up to this stage of the system, the signals are all at microwave frequencies (except, of course, the modulating signal M), and therefore the comparator 2, phase switches 5 and 6, and hybrids 8 and 9 are all microwave components and are conveniently constructed using microstipline techniques.

The receiver 10 comprises a first local oscillator 11, the output of which is mixed with the signals S+D and S−D in mixers 12 and 13, to convert them to a suitable first intermediate frequency. The IF signals are passed through IF amplifiers 14 and 15 to band pass filters 16 and 17. These filters select only a narrow range of frequencies, corresponding to a narrow range of doppler shifts in the radio signal received from the target, i.e. corresponding to a narrow range of relative target-to-aerial speeds. For this reason, the filters 16 and 17 are referred to as speed gates.

The filtered signals are passed through further IF amplifiers 20 and 21 to mixers 24 and 25, where they are mixed with a signal from a second local oscillator 26, to convert them to a suitable second intermediate frequency, The second IF signals are then respectively passed through gain trim and phase trim circuits 27 and 28, and are amplified by second IF amplifiers 30 and 31.

The outputs from the amplifiers 30 and 31 are combined in a sum circuit 32 and in a difference circuit 33 to produce IF output signals S' and D' respectively. It will be seen that nominally (i.e. assuming that the two channels of the receiver 10 are equally matched in gain and phase difference) the IF output S' from the sum circuit 32 is proportional to the RF sum signal S, while the IF output D' from the difference circuit 33 is proportional to the RF multiplexed difference signal D. Thus, nominally, the signal D' passes through the four values $D_1-D_4$, and thus varies periodically in phase with respect to the signal S', in a symmetrical manner, having an average value of zero. However, since a portion of each of the signals S and D has passed through each of the receiver channels, any mismatch in gain or phase difference between the channels will manifest itself in the output signals S' and D'. Specifically, if there is any mismatch in gain between the channels, the amplitudes of the four values of signal D' will be affected by different amounts, so that the average value of signal D' will no longer be zero, but will be positive or negative depending on which channel has the larger gain. Similarly, if there is any mismatch in phase difference between the channels, the phases of the four values of signal D' will be affected by different amounts, so that the average value of signal D' will again no longer be zero, being positive or negative depending on which channel has the larger phase difference.

In order to detect any mismatch in gain, the signal D' is compared with the signal S' in a phase-sensitive detector 34. Nominally, the average output of the detector is zero, but if there is any gain mismatch, the output of the detector 34 will develop a DC component. This component is measured in an integrator 35, and is used as a feedback signal to control the gain trim circuit 27, in such a manner as to tend to match the gain of the two channels and thus reduce the output of the integrator 35 to zero.

In order to detect any mismatch in phase, the signal D' is given a 90°, phase shift in phase change circuit 36, and is then compared with the signal S' in a phase-sensitive detector 37. Nominally, the average output of the detector 37 is zero, but if any phase mismatch is present, the output of the detector 37 will develop a D.C. component. This D.C. component is measured in an integrator 38 and is used as a feedback signal to control the phase trim circuit 28, in such a manner as to tend to match the phase differences of the two channels and thus reduce the output of the integrator 38 to zero.

When the channels are matched in gain and phase difference, the output of the phase sensitive detector 34 is proportional to the amplitude of the multiplexed difference signal D, and thus contains information concerning the two difference signals $D_{el}$ and $D_{az}$. To separate this information, the output of the detector 34 is fed to a demultiplexer 39. This demultiplexer is controlled by the modulating signal M from the oscillator 4, delayed in a delay circuit 40 by an amount equal to the overall delay introduced by the receiver 10. The demultiplexer 39 comprises a first phase-sensitive detector 41 in which the output of detector 34 is compared with the delayed modulating signal, to produce an output $E_{el}$ which is proportional to the amplitude of the error signal $D_{el}$. The demultiplexer 39 also comprises a second phase-sensitive detector 42 in which the output of detector 34 is compared with the delayed modulating signal, shifted in phase by 90°, by means of a phase-change circuit 43, to produce an output $E_{az}$ which is proportional to the amplitude of the error signal $D_{az}$.

The two outputs $E_{el}$ and $E_{az}$ from the demultiplexer 39 are used as error signals to control the operation of the servo motors (not shown) which tilt the aerial arrangement 1, in such a manner as to tend to reduce the amplitudes of the difference signals $D_{el}$ and $D_{az}$ to zero. The result of this is to cause the aerial 1 to track the target. The error signals are also fed to the autopilot (not shown) of the missile so as to enable the missile course to be suitably corrected to maintain it on a collision course with the target.

The output from the sum circuit 32 is fed to an automatic gain control detector circuit 44, which produces AGC signals for controlling the gains of IF amplifiers 20, 21, 30 and 31, in such a manner as to tend to maintain the output of the sum circuit 32 at a constant level.

The output of the sum circuit 32 is also applied to a frequency discriminator circuit 45, which produces an output signal proportional to the difference between the frequency of the IF signal from the sum circuit 32 and a predetermined value. This output is integrated in an integrator 46, and the result is used to control the frequency of a voltage-controlled oscillator 47, the purpose of which will be explained below.

In operation, the system is subjected to high vibration levels from the missile motor. Under these conditions, the first local oscillator 11 tends to be very noisy, i.e. to have significant noise sidebands. This is undesirable, since the performance of the overall system depends critically on the quality of the output of the first local oscillator. In order to overcome this problem, a so-called rear reference phase locked loop 49 is used. A rear aerial 50 is provided, to receive some of the illuminating radiation from the parent aircraft—one of the sidelobes of the radiating aerial may be used for this purpose—for use as a reference signal. This reference signal is mixed with the output of the local oscillator 11 in a mixer 51, to convert it to an intermediate frequency. The resulting IF signal is passed through an amplifier 52 and a band pass filter 53. The gain of the amplifier is controlled by an automatic gain control detector circuit 54, so as to tend to maintain the output of the filter 53 at a constant level. The output of the filter 53 is compared in a phase-sensitive detector 55 with the output of the oscillator 47, and the result is integrated in an integrator 56 and used to control the frequency of the local oscillator 11.

The result of this is that the frequency of the local oscillator 11 is locked in a fixed relationship to the frequency of the reference signal. Specifically, the frequency of the local oscillator is locked to a value equal to the difference between the reference signal frequency and the frequency of the oscillator 47. In this way, the vibration sidebands of the local oscillator 11 are substantially suppressed.

The AGC circuit 54 controls a trigger circuit 57 which in turn controls the time constant of the integrator 56 according to the level of the AGC signal, so as to reduce the bandwidth of the phase-locked loop 49 if the reference signal level drops below a certain predetermined value. In this way, the loop 49 adapts automatically to the level of the reference signal. Thus, when the reference signal received by the rear aerial 50 is strong, the bandwidth of the phase-locked loop 49 is relatively large, giving a significant reduction in the noise sidebands of the local oscillator 11. On the other hand, when the received reference signal level is low, the bandwidth of the loop 49 is reduced, so as to assist in filtering out the reference signal from noise generated in the amplifier 52. Thus, the signal-to-noise ratio of the reference signal is improved, although at the expense of a drop in the ability of the loop to suppress noise sidebands of the local oscillator 11.

In a modification, the bandwidth of the loop 11 may be varied continuously according to the reference signal level, instead of between two discrete values.

As mentioned above, the voltage-controlled oscillator 47 which controls the frequency of the first local oscillator 11, is in turn controlled, by way of the discriminator 45 and the integrator 46, by the frequency of the IF signal from the output of the receiver 10. This loop is arranged to maintain the frequency of the first IF signal (from the mixers 12 and 13) in the centre of the passband of the speed gate filters 16 and 17, as follows. If the relative velocity between the target and the missile or the missile and the parent aircraft changes slightly, the doppler frequency of the radio waves receiver by the aerial 1 will change. This will cause a shift in the frequency of the first IF signal away from the centre frequency of the speed gates 16 and 17, which in turn will cause a shift in the frequency of the second IF signal at the output of the receiver. This shift will be detected by the frequency discriminator 45, and will produce a change in the frequency of the oscillator 47, and hence in the frequency of the first local oscillator 11. This in turn will produce a change in the frequency of the first IF signal, and it is arranged that this change is in such a sense as to tend to return this signal to the centre of the passband of the speed gates 16 and 17.

Thus, it will be seen that the effect of this loop is to maintain the frequency of the first IF signal in the centre of the passband of the speed gates 16 and 17. As a result, the system tracks the doppler frequency of the target. This permits the system to discriminate between different targets on the basis of differences in their speeds even although they may be separated by too small an angle for sufficient angular discrimination.

The system differs from conventional doppler tracking system, in which doppler tracking is performed by means of an oscillator situated at an IF stage of the receiver. In the present system, doppler tracking is performed using the first local oscillator, which enables the speed gate filters 16 and 17 to be placed at an early stage of the receiver. This means that the major portion of the receiver 10 has to deal with only a small range of frequencies, which simplifies the design of the receiver considerably.

Figure 3:
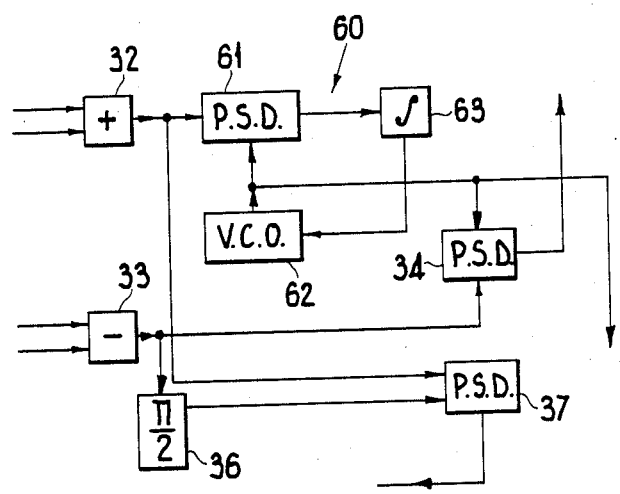
FIGS. 3 and 4 are schematic block circuit diagrams illustrating modifications of the circuit shown in FIG. 2.

Referring now to FIG. 3, in a modification of the circuit shown in FIG. 2, there is provided at the output of the receiver 10 a phase locked loop 60, comprising a phase-sensitive detector 61, arranged to compare the output of the sum circuit 32 with the signal from a voltage controlled oscillator 62. The resultant signal from the detector 61 is integrated in an integrator 63, and is used to control the frequency of the oscillator 62. In this way, the frequency of the oscillator 62 is locked on to the frequency of the IF signal from the sum circuit 32. The output signal from the oscillator 62 thus has the same frequency as the output signal from the receiver, but has a much narrower bandwidth. The effect of the phase-locked loop 60 is thus to act as a very narrow band-pass filter for the receiver output signal, the passband of this filter depending on the time constant of the integrator 63. This assists in discriminating between targets of closely similar frequencies, especially closely spaced targets and targets in formation.

The output from the oscillator is utilised, in place of the output from the sum circuit 32, for feeding to the discriminator circuit 45. This signal is also used for comparison with the output from the difference circuit 33, in the phase-sensitive detector 34, to produce the feedback signal for controlling the gain trim circuit 27.

Figure 4:
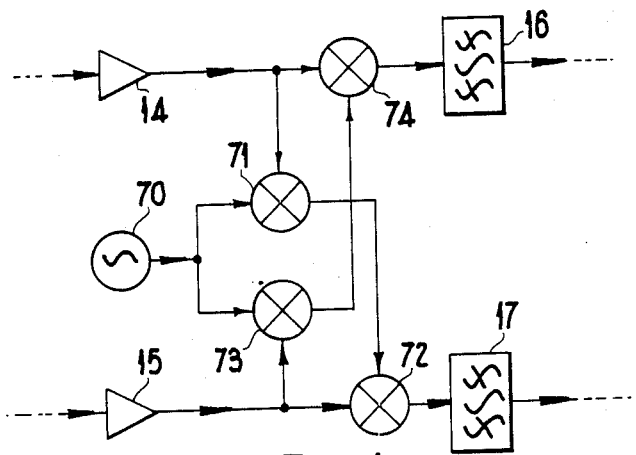

Referring now to FIG. 4, this shows another modification of the arrangement of FIG. 2 which is particularly useful in eliminating the effect of jamming noise originating in a direction at an angle to the axis of the aerial.

In this modification, the two channels are cross-coupled as follows. The signal from amplifier 14 in one channel is mixed with a signal from an oscillator 70 (typically having a frequency of the order of twice the IF frequency plus 100 KHz) in a mixer 71, so as to shift it in frequency, and the result is injected into the speed gate filter 17 of the other channel via a mixer 72. Similarly the signal from amplifier 15 is mixed with the signal from oscillator 70 in a mixer 73 and the result is injected into speed gate filter 16 via a mixer 74.

The result of this cross-coupling is that some jamming noise from each channel at a frequency stepped off from the doppler frequency is introduced into the speed gate filter of the other channel in addition to the jamming noise already present in that channel, giving two components of jamming noise in each channel, one positive tracking and the other negative tracking. These four components of jamming noise tend to cancel each other out at the output phase-sensitive detector 34 of the receiver, and not to produce an angular error output. For cancellation to occur, it is necessary to have matching of the open loop gain and phase change of the signal paths in the two channels prior to the speed gate filters, and matching of the coupling mixers.

What is claimed is:
1. A static-split tracking radar system comprising
  (A) an aerial
    (i) having more than two outputs,
  (B) a first combining circuit for combining signals from said aerial outputs to produce at least two receiver input signals,
    (i) the relative phases and amplitudes of which contain information characterizing the orientation of a target relative to the aerial,
  (C) a receiver having two channels to which said receiver input signals are respectively applied,
  (D) a second combining circuit for combining output signals from the channels of said receiver to produce a feedback signal,
  (E) said first and second combining circuits being such that said feedback signal characterizes the degree of mismatch between said channels,
  (F) the system also comprising at least one trimming circuit which is connected in one of said channels and which is responsive to said feedback signal for automatically correcting mismatch between said channels,
  (G) means to produce a modulating waveform,
  (H) said first combining circuit including means to modulate said receiver input signals in synchronism with the modulating waveform to cause said receiver input signals to vary periodically in amplitude and phase relative to each other in such a manner that the average value of their difference over one period of said modulating waveform is zero, and (I) differencing and averaging means coupled to receive the output signals from said receiver channels and to produce said feedback signal by averaging the difference of the output signals from said receiver channels over at least one period of said modulating waveform, whereby when said channels are equally matched, said feedback signal is zero, and when said channels are mismatched said feedback signal is non-zero.

2. A system according to claim 1, wherein said first combining circuit includes means coupled to receive said signals from said aerial outputs and to add and subtract said signals from said aerial outputs to produce a sum signal and at least two difference signals, and a multiplexer coupled to receive said difference signals and to modulate said difference signals by multiplexing said difference signals together in synchronism with said modulating waveform to form a multiplexed difference signal.

3. A system according to claim 2 wherein said first combining circuit includes adding and subtracting means coupled to receive and to add together said sum signal and said multiplexed difference signal to form one of said receiver input signals and to receive and to subtract said sum signal from said multiplexed difference signal to form the other of said receiver input signals.

4. A system according to claim 2, in which said means to modulate is coupled to receive the two difference signals and to perform said multiplexing by phase-modulating the two difference signals by 180° in synchronism with the modulating waveform, said means to modulate including phase shifting means to apply the modulation to one difference signal in quadrature with respect to the modulating waveform relative to the modulation applied to the other difference signal, and means coupled to receive and to add together the modulated difference signals to produce said multiplexed difference signal.

5. A static-split tracking radar system comprising
(A) an aerial
  (i) having more than two outputs,
(B) a first combining circuit for combining signals from said aerial outputs to produce at least two receiver input signals,
  (i) the relative phases and amplitudes of which contain information characterizing the orientation of a target relative to the aerial,
(C) a receiver having two channels to which said receiver input signals are respectively applied,
(D) a second combining circuit for combining output signals from the channels of said receiver to produce a feedback signal,
(E) said first and second combining circuits being such that said feedback signal characterizes the degree of mismatch between said channels,
(F) the system also comprising at least one trimming circuit which is connected in one of said channels and which is responsive to said feedback signal for automatically correcting mismatch between said channels, and
(G) means to produce a modulating waveform,
(H) said first combining circuit including means to modulate said receiver input signals in synchronism with the modulating waveform to cause said receiver input signals to vary periodically in amplitude and phase relative to each other in such a manner that the average value of their difference over one period of said modulating waveform is zero.

6. A static-split tracking radar system comprising
(A) an aerial
  (i) having more than two outputs,
(B) a first combining circuit for combining signals from said aerial outputs to produce at least two receiver input signals,
  (i) the relative phases and amplitudes of which contain information characterizing the orientation of a target relative to the aerial,
(C) a receiver having two channels to which said receiver input signals are respectively applied,
(D) a second combining circuit for combining output signals from the channels of said receiver to produce a feedback signal,
(E) said first and second combining circuits being such that said feedback signal characterizes the degree of mismatch between said channels,
(F) the system also comprising at least one trimming circuit which is connected in one of said channels and which is responsive to said feedback signal for automatically correcting mismatch between said channels,
(G) a phase lock loop connected in the second combining circuit, and
(H) the output signal of said phase lock loop providing a signal of reduced bandwidth.

7. A static-split radar system as claimed in claim 6, wherein said phase lock loop comprises a phase sensitive detector, an integrator and a voltage controlled oscillator all connected in series to form said phase lock loop, wherein one input of said phase sensitive detector is connected to receive a signal from said second combining circuit and the output of said voltage controlled oscillator is connected as the other input of said phase sensitive detector and wherein the outut of said voltage controlled oscillator forms the outut of said phase lock loop.

8. A static-split tracking radar system comprising
(A) an aerial
  (i) having more than two outputs,
(B) a first combining circuit for combining signals from said aerial outputs to produce at least two receiver input signals,
  (i) the relative phases and amplitudes of which contain information characterizing the orientation of a target relative to the aerial,
(C) a receiver having two channels to which said receiver input signals are respectively applied,
(D) a second combining circuit for combining output signals from the channels of said receiver to produce a feedback signal,
(E) said first and second combining circuits being such that said feedback signal characterizes the degree of mismatch between said channels,
(F) the system also comprising at least one trimming circuit which is connected in one of said channels and which is responsive to said feedback signal for automatically correcting mismatch between said channels,
(G) each said receiver channel comprising
  (i) a mixer,
  (ii) an intermediate frequency amplifier and
  (iii) a filter connected in series, and
(H) means for cross coupling a signal containing a percentage of the output of the intermediate frequency amplifier of each channel into the output of the intermediate frequency amplifier of the other respective channel.

9. A static-split radar system as claimed in claim 8, wherein said means for cross coupling includes an oscillator having an output frequency of twice the intermediate frequency offset by a relatively small frequency, and first and second mixers, wherein the output of each intermediate frequency amplifier is mixed with the output of the oscillator in the respective first or second mixer and including first and second adders, and wherein the outputs of the first and second mixers are added to respective outputs of the intermediate frequency amplifiers, the outputs of said first and second adders forming the respective inputs for said filters.

10. A static-split tracking radar system comprising
 (A) an aerial
  (i) having more than two outputs,
 (B) a first combining circuit for combining signals from said aerial outputs to produce at least two receiver input signals,
  (i) the relative phases and amplitudes of which contain information characterizing the orientation of a target relative to the aerial,
 (C) a receiver having two channels to which said receiver input signals are respectively applied,
 (D) a second combining circuit for combining output signals from the channels of said receiver to produce a feedback signal,
 (E) said first and second combining circuits being such that said feedback signal characterizes the degree of mismatch between said channels,
 (F) the system also comprising at least one trimming circuit which is connected in one of said channels and which is responsive to said feedback signal for automatically correcting mismatch between said channels,
 (G) a second aerial,
 (H) a local oscillator the output frequency of which is mixed with one of said receiver channel inputs, and
 (I) means for controlling the frequency of said local oscillator both in response to a signal received at said second aerial and in response to a signal obtained from an output signal of said second combining circuit.

11. A static-split radar system as claimed in claim 10, wherein said means for controlling the frequency of said local oscillator includes a phase sensitive detector, wherein one input of said phase sensitive detector is a signal obtained from the signal received at said second aerial and wherein the other input of said phase sensitive detector is a signal obtained from said output signal obtained from the second combining circuit.

12. A static-split radar system as claimed in claim 11, which further comprises a frequency discriminator, an integrator and a voltage controlled oscillator connected in series, in which in said frequency discriminator the output signal of said second combining circuit is compared with a fixed frequency, in which the output of said frequency discriminator is integrated in said integrator, in which the output of said integrator is used as a control voltage for said voltage controlled oscillator, and in which the output of said voltage controlled oscillator is said signal obtained from the output signal of said second combining circuit, and which further comprises a further mixer, a controlled amplifier of defined output bandwidth connected in series, in which the signal obtained from said second aerial is mixed with the output signal from the local oscillator in said mixer, and in which the output of the mixer is fed to the input of said controlled amplifier of defined output bandwidth, the output signal of which is the said signal obtained from the signal received at said second aerial, and wherein the output of said phase sensitive detector is connected to an integrator the output of said integrator being used to control the frequency of said local oscillator.

13. A static-split radar system as claimed in claim 12, further including a phase lock loop connected in the second combining circuit and in which the output signal of said second combining circuit is obtained from the phase lock loop and is connected to the input of said frequency discriminator.

14. A static-split radar system as claimed in claim 11, further including a phase lock loop connected in the second combining circuit and in which the output signal of said second combining circuit is obtained from the phase lock loop.

15. A static-split radar system as claimed in claim 10, further including a phase lock loop connected in the second combining circuit and in which the output signal of said second combining circuit is obtained from the phase lock loop.

16. A tracking radar system for use in a moving body, comprising a first aerial; a superheterodyne receiver for processing signals from the first aerial, the receiver including a local oscillator; a second aerial for receiving a reference signal; a phase-locked loop for locking the frequency of said local oscillator in a fixed relationship to that of the reference signal; and means to automatically adjust the bandwidth of the phase-locked loop according to the received strength of the reference signal, so that when the received reference signal is strong, the bandwidth is relatively wide, and when the received reference signal is weak, the bandwidth is relatively narrow.

* * * * *